United States Patent
Choong et al.

(10) Patent No.: US 8,173,998 B2
(45) Date of Patent: May 8, 2012

(54) RADIATION EMITTING DEVICE

(75) Inventors: Vi-En Choong, Carlsbad, CA (US); Stelios A. Choulis, Lemesos (CY); Mathew K. Mathai, Monroeville, PA (US)

(73) Assignee: OSRAM Opto Semiconductors GmbH, Regensburg (DE)

( * ) Notice: Subject to any disclaimer, the term of this patent is extended or adjusted under 35 U.S.C. 154(b) by 734 days.

(21) Appl. No.: 12/157,061

(22) Filed: Jun. 6, 2008

(65) Prior Publication Data

US 2009/0039294 A1 Feb. 12, 2009

(30) Foreign Application Priority Data

Aug. 7, 2007 (DE) .......................... 10 2007 037 097
Nov. 9, 2007 (DE) .......................... 10 2007 053 396

(51) Int. Cl.
H01L 35/24 (2006.01)

(52) U.S. Cl. ............ 257/40; 257/79; 313/503; 313/504; 313/506

(58) Field of Classification Search .................... 257/40, 257/79; 313/503, 504, 506
See application file for complete search history.

(56) References Cited

U.S. PATENT DOCUMENTS

| 6,759,145 | B2 | 7/2004 | Lin et al. | |
|---|---|---|---|---|
| 7,009,338 | B2 | 3/2006 | D'Andrade et al. | |
| 2003/0042848 | A1 * | 3/2003 | Park et al. | 313/503 |
| 2005/0077817 | A1 | 4/2005 | Yamazaki et al. | |
| 2006/0279203 | A1 | 12/2006 | Forrest et al. | |
| 2007/0015003 | A1 | 1/2007 | Hwang et al. | |
| 2007/0138947 | A1 | 6/2007 | Popovic et al. | |
| 2008/0102310 | A1 * | 5/2008 | Thompson et al. | 428/690 |
| 2008/0203406 | A1 * | 8/2008 | He et al. | 257/94 |

FOREIGN PATENT DOCUMENTS

| DE | 102 06 981 | 8/2003 |
|---|---|---|
| EP | 1 670 082 | 6/2006 |
| EP | 1 670 083 | 6/2006 |
| EP | 1 705 727 | 9/2006 |
| EP | 1 921 112 | 5/2008 |
| WO | WO 2005/057679 | 6/2005 |
| WO | WO 2006/038020 | 4/2006 |
| WO | WO 2006/097064 | 9/2006 |
| WO | WO 2006/113106 | 10/2006 |
| WO | WO 2006/130883 | 12/2006 |
| WO | WO 2007/020952 | 2/2007 |

* cited by examiner

*Primary Examiner* — Anthony Ho

(74) *Attorney, Agent, or Firm* — Cozen O'Connor

(57) ABSTRACT

A radiation emitting device comprising a first electrode, which emits first charge carriers having a first charge during operation, a first charge carrier transporting layer, which comprises a fluorescent substance, a second charge carrier transporting layer, which contains a phosphorescent substance, and a second electrode, which emits second charge carriers having a second charge during operation, wherein during operation the second charge carrier transporting layer is largely free of first charge carriers.

26 Claims, 2 Drawing Sheets

RADIATION EMITTING DEVICE

RELATED APPLICATIONS

This patent application claims the priorities of German patent application 10 2007 037 097.2 filed Aug. 7, 2007 and of German patent application 10 2007 053 396.0 filed Nov. 1, 2007, the disclosure contents of both of which are hereby incorporated by reference.

FIELD OF THE INVENTION

The invention is related to a radiation emitting device.

BACKGROUND OF THE INVENTION

A widespread problem of radiation emitting devices is the low yield of emissive radiation in relation to the voltage applied to the devices.

SUMMARY OF THE INVENTION

One object of the invention is to provide a radiation emitting device which has an increased yield of emitted radiation.

This and other objects are attained in accordance with one aspect of the invention directed to a radiation emitting device comprising a first electrode, which emits first charge carriers having a first charge during operation, a first charge carrier transporting layer, which comprises a fluorescent substance and is arranged on the first electrode, a second charge carrier transporting layer, which contains a phosphorescent substance and is arranged on the first charge carrier transporting layer, a second electrode, which emits second charge carriers having a second charge during operation and is arranged on the second charge carrier transporting layer, wherein during operation of the device the second charge carrier transporting layer is largely free of first charge carriers.

In a radiation emitting device having a layer sequence of this type, the second charge carrier transporting layer is largely free of charge carriers having the first charge which are emitted by the first electrode during operation.

In this case, "largely free" should be understood to mean that the charge carriers having the first charge in the second charge carrier transporting layer, during operation of the device, have a proportion of the charge transport in said layer which makes up at most a proportion of 0.1% of the total charge transport in said layer. This can for example mean, in particular, that the difference between the charge transport mediated by the first charge carriers and the charge transport mediated by the second charge carriers is at least three powers of ten. The consequence of this is that in said layer during operation of the device almost only second charge carriers migrate and therefore practically no charge carriers having the first and the second charge can meet one another and recombine. As a result, in said layer, in which a phosphorescent substance is situated, no energy that could excite the phosphorescent substance into an electronically excited state can be released by recombination of the first and second charge carriers. Consequently, the energy for the excitation of the phosphorescent substance has to be transferred from the first charge carrier transporting layer into the second charge carrier transporting layer.

The second charge carrier transporting layer can be unipolar and/or block charge carriers having the first charge. Consequently, during the operation of the device, the second charge carrier transporting layer then transports only second charge carriers but does not transport first charge carriers, or transports said first charge carriers only to a subordinate extent, with the consequence that the second charge carrier transporting layer is largely free of first charge carriers during the operation of the device.

Consequently, one embodiment of the invention comprises at least two electrodes between which at least two charge carrier transporting layers are arranged, at least one layer of which transports only charge carriers having the second charge, and also at least one further layer in which charge carriers having both the first and second charges are transported.

If charge carriers having the first charge and charge carriers having the second charge, which is charged oppositely to the first charge, meet one another in the first charge carrier transporting layer, then they can recombine to form excited electronic states (excitons). The exciton is a two-particle state comprising excited negatively charged electron and positively charged charge carrier, the so-called "hole" or defect electron. If a molecule is in the electronically excited state, then there are a number of possibilities for emitting the energy again via different relaxation processes. In the case of thermal relaxation, the energy is emitted without radiation as thermal energy. A further possibility is energy emission in the form of radiation, for example visible radiation in the range of approximately 400 to 800 nm, and radiation in the UV range and infrared IR range. A distinction is made here essentially between two cases: fluorescence and phosphorescence. Fluorescence is understood here to mean the emission of radiation by relaxation from an electronically excited singlet state in which the electrons have paired electron spins in the excited state. By contrast, phosphorescence is understood to mean a relaxation process in which the relaxation takes place from an electronically excited triplet state in which the electrons have parallel electron spins in the excited state.

An excited fluorescent substance can thus emit radiation in the form of fluorescence. The transition from a singlet state to a triplet state is actually forbidden on account of the associated spin reversal, since the spin reversal contravenes the quantum mechanical conservation of the spin angular momentum. Consequently, a spin reversal is only possible if the change in the spin angular momentum is compensated for by the change in another angular momentum, which usually takes place by way of the electronic orbital angular momentum.

The recombination of electron and "hole" gives rise to an excited electronic state, an exciton. An exciton is a two-particle state whose spin half particles, electron and hole, can combine to give a total spin 0, a singlet exciton, or a total spin 1, a triplet exciton. On account of spin statistics, singlet and triplet excitons form in the ratio of 1:3.

Fluorescent or phosphorescent substances can be converted to an excited state by the energy of said excitons. Relaxation is then in turn possible from said state, the released energy being emitted in the form of visible radiation, for example, in the course of said relaxation.

In the second charge carrier transporting layer, owing to the fact that charge carriers having the first charge are largely absent, it is practically impossible for charge carriers having the first and the second charge to meet one another, and, consequently, it is also not possible for the two charge carriers to recombine to form excitons. Consequently, the phosphorescent substance present in said second charge carrier transporting layer is put into an excited state by the energy transported by the excitons, preferably the triplet excitons of the first charge carrier transporting layer by means of energy transfer mechanisms into the second charge carrier transporting layer.

It is desirable for a device to obtain a highest possible radiation yield, and to have the possibility of being able to cover a widest possible radiation spectrum. A good radiation yield means a highest possible quotient of radiation yield obtained in relation to the voltage applied to the first and second electrode. For this purpose, it is desirable not only to convert the energy into radiation energy which is present in an excited electron singlet state, but also to use the energy for radiation generation which is present in excited electronic triplet states. The latter makes up 75% on account of spin statistics, since a second electron in an excited electronic state can assume three different orientation possibilities with respect to the spin of a first electron which lead to a triplet state, whereas only one orientation possibility leads to the spin pairing and thus to the singlet state. The attempt, in addition to the singlet emission, also to convert a largest possible part of the energy still present into triplet emission is also referred to as "triplet harvesting". In this case, the phosphorescent substance serves to take up the excited electronic states present in the triplet excitons of the fluorescent substance by means of energy transfer mechanisms. By means of radiative relaxation from said triplet excitons of the phosphorescent substance, the energy present in the triplet states is then used with respect to the radiation yield of the radiation emitting device. If the phosphorescent substance were not present in the radiation emitting device, then the triplet excitons of the fluorescent substance would relax by means of radiationless quenching processes, with the consequence that the excited electronic states present in the triplet excitons of the fluorescent substance make no contribution or only a subordinate contribution to the radiation of the radiation emitting device.

Further layers can be present between the electrodes and the two charge carrier transporting layers, and also the two charge carrier transporting layers themselves.

Thus, in one embodiment of the invention, a unipolar charge carrier transporting layer, which blocks the charge carriers having the first charge or can transport only charge carriers having the second charge, is arranged between the first charge carrier transporting layer and the second charge transporting layer. Consequently, penetration of charge carriers having the first charge into the second charge carrier transporting layer can be prevented or reduced, with the consequence that the second charge carrier transporting layer is largely free of charge carriers having the first charge during the operation of the device. In this case, the energy levels of the matrix of the second charge carrier transporting layer do not have to be selected in regard to this circumstance.

In accordance with a further embodiment according to the invention, charge carrier transport paths run through the radiation emitting device during the operation of the device. In connection with this invention, charge carrier transport paths are understood to mean the path that can be taken by the charge carriers during operation perpendicular to the layer course, that is to say through the layers coming from one electrode in the direction of the electrode having the opposite charge. In this case, for the charge carriers having the first charge, a charge carrier transport path occurs which is predefined by that region of the layer sequence of the device which is delimited by the first electrode and the first charge carrier transporting layer. For the charge carriers having the second charge, a charge carrier transport path results which, proceeding from the second electrode, extends at least through the second charge carrier transporting layer into the first charge carrier transporting layer. Consequently, during the operation of the device, the charge carrier transport path for the first charge carriers is shorter than the charge carrier transport path for the second charge carriers.

During the operation of the device, the corresponding charge carriers can pass through layers which lie between the electrodes mentioned and the charge carrier transporting layers to be reached in each case. Thus, by way of example, a charge carrier having the first charge can pass through an exciton blocking layer situated between the first electrode and the first charge carrier transporting layer, which correspondingly lengthens the charge carrier transport path in comparison with a layer sequence in which the exciton blocking layer is not present. If the exciton blocking layer lies between the second electrode and the second charge carrier transporting layer, then the charge carriers having the second charge can pass through it during the operation of the device, whereby the charge carrier transport path of the charge carriers having the second charge would be correspondingly lengthened.

In a further embodiment of the invention, the radiation emitting device is for example an organic light emitting diode (OLED) comprising one or more organic layers or layers containing organic materials. The organic substances can be for example the material of the first charge carrier transporting layer and/or second charge carrier transporting layer, and also the phosphorescent and/or fluorescent substance. Furthermore, the fluorescent and/or phosphorescent substance can also have charge carrier transporting properties and, consequently, the respective charge carrier transporting layer can predominantly consist of said substances or comprise them as basic components. However, the fluorescent and/or phosphorescent substance, irrespective of whether said substance is of organic or inorganic nature, can also be present as a dopant in a matrix material. In this case, the dopant itself can contribute to the charge transport, but this is not obligatory. The organic substances can be polymeric electroluminescent substances or non-polymeric substances, so-called "small molecules". In this case, electroluminescence is understood to mean the property that a substance can be excited at least partly to emit radiation, e.g. light, by applying an electrical voltage.

The OLED can have a substrate on the side of the first electrode and also on the side of the second electrode, on which substrate the functional layer stack comprising the charge carrier transporting layers can be arranged.

In a further embodiment of a device according to the invention, the first electrode can be an anode and also a cathode. The same applies to the second electrode as well, wherein the second electrode has the opposite polarity to the first electrode. That is to say that if the first electrode is a cathode, then the second electrode is an anode. Likewise, it is possible for the first electrode to be an anode, and the second electrode a cathode.

The charge carriers having the first charge can therefore be negative charge carriers, electrons, if the first electrode is a cathode, and also positive charge carriers, so-called "holes", if the first electrode is an anode. The charge carriers having the second charge have the corresponding opposite polarity to the charge carriers having the first charge. That is to say that if the second electrode is an anode, then the charge carriers having the second charge are holes. However, the opposite case where the charge carriers having the first charge are holes if the first electrode is an anode, and the charge carriers having the second charge are electrons, is likewise possible as well.

If an embodiment according to the invention comprises an anode as first electrode, then the following layers are a hole transporting and electron transporting layer as first charge carrier transporting layer, an electron transporting layer as second charge carrier transporting layer and a cathode as second electrode.

If an embodiment according to the invention comprises a cathode as first electrode, then the following layers are a hole transporting and electron transporting layer as first charge carrier transporting layer, a hole transporting layer as second charge carrier transporting layer and an anode as second electrode.

In a further embodiment according to the invention, the radiation emitting device can comprise a second electrode as anode and a first electrode as cathode. The second electrode, the anode, is followed by a hole inducting layer (HIL), a second charge carrier transporting layer in the form of a hole transporting layer (HTL) and a first charge carrier transporting layer in the form of an electron transporting layer (ETL). When the forward potential is applied, the anode injects positive charge carriers, so-called holes, and the cathode injects electrons into the organic layers. The injected holes and electrons migrate respectively to the opposite charged electrodes. Recombination of holes with electrons gives rise to so-called excited electronic states, the excitons.

Fluorescent or phosphorescent substances can be excited by the energy of said excitons, said substances then emitting radiation. Two emission routes are available for the emission of visible radiation. Firstly relaxation from an excited singlet state, and secondly relaxation from an excited triplet state. A triplet state is distinguished by the fact that the electrons of the excited electronic state have an equidirectional spin, whereas in a singlet state the electrons of the excited electronic state have an opposite spin (the spins are "paired"). In addition, however, the excited states can also emit their energy by means of radiationless quenching processes, or else the emitted radiation does not lie in the visible range. In connection with this invention, the term "radiation" is used under the meaning of electromagnetic radiation in the range of IR to UV in each case inclusive. In order to obtain an emission in the visible range, the different layers of an OLED are doped with corresponding substances, or produced from said substances.

In the case of the hole transporting layer (HTL), both the position of the highest occupied molecular orbital (HOMO) and the separation between HOMO and the lowest unoccupied molecular orbital (LUMO) should be adapted to the molecular orbitals HOMO/LUMO of the other layers and materials of the OLED. The HOMO level must be low enough to be able to inject the holes from the anode. On the other hand, however, it is permitted to be only low enough that the required energy barrier with respect to the HOMO of the electron transporting layer (ETL) is not too great, such that the holes can migrate in the electron transporting layer in order to be able to recombine with the electrons there. By contrast, if no recombination is intended to take place in the electron transporting layer, that is to say no holes are intended to pass into said layer, then the HOMO of the HTL must be chosen to be correspondingly lower than that of the ETL. This gives rise to a hole barrier, that is to say a hole blocking layer, at this location of the OLED.

The HOMO-LUMO separation of the HTL, and also of other layers, should be chosen to be sufficiently large, larger than in the case of the emissive dopant, in order that the emitted radiation is not immediately absorbed again in the layer itself. The energy difference between LUMO-HTL and LUMO-ETL must be chosen according to whether or not electrons are intended to pass into the HTL. If no electrons are intended to pass into the HTL, that is to say that the latter is intended to serve as an electron barrier, then the LUMO of the HTL must be at a higher energetic level than the LUMO of the ETL. The LUMO of an electron blocking layer should preferably be at least 300 meV above that of the electron transporting layer. By contrast, if the recombination is intended to be able to take place in the HTL and the electrons are intended to be able to migrate into the HTL, then the energy difference between LUMO-HTL and LUMO-ETL must be kept small. The ETL should furthermore have a LUMO that is low enough in order that the electrons can be injected from the cathode into said LUMO. The material of the cathode should be coordinated with this, if appropriate. If the OLED also comprises a hole injecting layer (HIL), then the energy levels should be adapted to those of the anode and of the HTL, that is to say that they must lie between the two, which reduces the work function of the holes from the anode into the succeeding layer, here the HIL, and thus facilitates the hole transition from the anode to the subsequent layer. The HOMO of the HIL should be not more than 700 meV above that of the anode, preferably not more than 500 meV.

If a layer has a hole blocking function, by contrast, then its HOMO must lie below the HOMO of the layer from which the holes are intended to be kept away. In this case, the HOMO of the blocking layer should lie at least 300 meV, but more expediently 700 meV, below that of the subsequent layer.

One embodiment of an OLED according to the invention can also comprise an exciton blocking layer. Such a layer would preferably be located between the second charge carrier transporting layer and the second electrode. The energy levels of said layer must likewise be coordinated with those of the adjacent layers. In this case, the energy difference ($\Delta E$) between HOMO and LUMO is of importance in the case of the exciton blocking layer. Said energy difference defines the energy of the exciton. Consequently, an exciton cannot diffuse, or can diffuse only to a subordinate extent, into a layer whose $\Delta E$ is 100 meV, or more, greater than the energy of the exciton, or the $\Delta E$ of the layer in which the exciton was formed. Furthermore, an important factor is whether said layer is intended to conduct electrons or holes. The energy level of the LUMO and HOMO should be chosen accordingly. If the electrons are intended to be blocked, for example, then the LUMO of the blocking layer must be higher than that of the layer in which the electrons are transported toward the blocking layer.

Irrespective of the presence of the first exciton blocking layer, in further devices a second exciton blocking layer can also be present for example between the first charge carrier transporting layer and the layer which injects the charge carriers having the first charge into the first charge carrier transporting layer. Said exciton blocking layer would prevent diffusion of the excitons formed in the first charge carrier transporting layer into the injecting layer.

However, if an exciton blocking layer is positioned before a cathode, for example, then it is thereby possible to prevent the quenching of the excitons and the associated conversion into radiationless energy.

In further embodiments of this invention it is possible to coordinate the energy levels of the individual layers with one another. For this purpose, either the matrix materials of the first and second charge carrier transporting layers or the dopants which are introduced into the matrix layers of said layers must have corresponding energy levels. The HOMO (Highest Occupied Molecular Orbital) and LUMO (Lowest Unoccupied Molecular Orbital) levels of the substances can be determined in various ways. One common method for determining the HOMO level is ultraviolet photoelectron spectroscopy (UPS). Inverse photoemission spectroscopy (IPS), for example, is suitable for determining the LUMO level. The energy difference ($\Delta E$) between HOMO and LUMO can be calculated directly by comparing absorption and emission spectrums. Reference should be made to the corresponding textbooks for the mode of operation of the techniques mentioned above.

In order to reduce or avoid quenching of the phosphorescence dopants as phosphorescent substance by the matrix substance into which it was introduced, the energy level of the dopant from which phosphorescence takes place ($T_1$ level) should lie between the $T_1$ level of the matrix substance. That is because if the $T_1$ level of the matrix substance lies below that of the dopant, then a radiationless triplet exciton transfer from the dopant to the matrix can occur. On account of their low $T_1$ levels, therefore, polymeric compounds having good charge carrier transport properties are suitable only to a limited extent as a matrix material for phosphorescent dopants. The shorter the wavelengths of the radiation emitted from the dopant, the greater the energy difference between the $T_1$ level and the energetic ground state. This means that the use of phosphorescence dopants which emit in the blue spectral range, on account of their high $T_1$ levels, is more difficult to be able to coordinate with the $T_1$ levels of possible matrix materials than the use of phosphorescent dopants which emit in the red range.

The present device solves the problem of energy level matching through the combination of fluorescent substances (singlet emitters) and phosphorescent substances (triplet emitters) in different layers, that is to say in different layers which can have different matrix substances. The same analogously also holds true for the energy level of the fluorescence dopant from which fluorescence takes place ($S_1$ level) and the corresponding $S_1$ level of the matrix, provided that the matrix does not itself function as an emitter.

If the embodiment of a device contains more than just one layer provided with phosphorescent dopants, then the sequence of these layers must be taken into consideration. The layer with the phosphorescent dopant having the lowest $T_1$ level should be furthest away from the layer in which the excitons are formed, that is to say be the last one of the layers with a phosphorescent substance through which triplet excitons pass. That is unless the energy transfer from the matrix material to the dopant, on account of the position of the energy levels of the excited states in said layer, is significantly poorer and less efficient than in the other layers having other matrix-dopant combinations; in which case in turn said layer, in the layer sequence of the device, should lie closer again to the first charge carrier transporting layer, in which the excitons are formed, in order to obtain the best possible radiation yield.

One preferred embodiment comprises a second charge carrier transporting layer comprising phosphorescent substances that emit in different wavelengths. In this case, the second charge carrier transporting layer can be divided into partial regions, each of which comprises a different phosphorescent substance. In this case, the partial region located closest to the first charge carrier transporting layer comprises the phosphorescent substance which emits radiation having the shortest wavelength. The further partial regions comprise other phosphorescent substances in which the wavelength of the radiation emitted by them increases with increasing distance from the first charge carrier transporting layer.

If the second charge carrier transporting layer comprises two phosphorescent substances, for example, then it can be divided into two partial regions. A first partial region comprises, for example, a phosphorescent substance that emits in the green range, and a second partial region comprises a phosphorescent substance that emits in the red range. The first partial region is then arranged closer to the first charge carrier transporting layer than the second partial region.

A further preferred embodiment comprises at least two second charge carrier transporting layers having different matrix materials. The phosphorescent substances of these layers emit radiation having different wavelengths. In this case, the second charge carrier transporting layers are arranged in such a way that the wavelength of the radiation emitted by the phosphorescent substances increases with increasing distance from the first charge carrier transporting layer.

Thus, one embodiment comprises, for example, two second charge carrier transporting layers, wherein one second charge carrier transporting layer comprises a substance which is phosphorescent in the green range and the other second charge carrier transporting layer comprises a substance which is phosphorescent in the red range. Said one second charge carrier transporting layer with the green emitter is then arranged closer to the first charge carrier transporting layer than the other second charge carrier transporting layer with the red emitter.

A further aspect is also the desired hue which the device, e.g. the OLED, is intended to emit, that is to say the sum of the spectra of the fluorescent and phosphorescent substances. The proportion of the radiation which the individual dopants contribute to the overall spectrum is influenced by varying the sequence of individual layers comprising the phosphorescent or fluorescent dopants. In this case, not only the position but also the thickness of the respective layer plays a part, as does the density with which the dopant is introduced the matrix layer. The closer the second charge carrier transporting layer having the phosphorescent substance as dopant, for example, is located to the first charge carrier transporting layer, the exciton forming layer, the better the energy is transferred from the matrix material to the dopant, the thicker the matrix material and the higher the proportion of the dopant in the matrix, then the greater the contribution of the emission of said dopant to the overall spectrum of the OLED. In the case where the second charge carrier transporting layer was produced predominantly or even exclusively from the phosphorescent substance, then the position thereof in the layer sequence and its layer thickness are crucial for that proportion of the total emission of the radiation emitting device which is made up of the emission from said layer.

A further embodiment of an OLED according to the invention comprises at least two charge carrier transporting layers, wherein the first charge carrier transporting layer itself comprises a fluorescent material or was doped with a fluorescent material. Fluorescence involves visible radiation that is emitted as a result of relaxation from an excited singlet state to the ground state. The second charge carrier transporting layer contains a phosphorescent substance. Phosphorescence involves visible radiation that is emitted as a result of relaxation from an excited triplet state to the ground state.

The second charge carrier transporting layer is substantially free of charge carriers having the first charge and transports only charge carriers having the second charge. Therefore, recombination of electrons and holes does not take place in the second charge carrier transporting layer and, consequently, nor are any excitons formed in said layer. The consequence of this is that the phosphorescent substance in said layer cannot be excited by energy originating from excitons that were formed in said layer. This in turn means that the phosphorescent substance can only be excited by energy that was transferred from another layer into the layer in which the phosphorescent substance is situated. This energy transport can be effected for example by means of the so-called Dexter transfer mechanism or the Förster transfer mechanism. The Dexter transfer mechanism is an electron exchange mechanism via overlapping orbitals or wave functions between different molecules, e.g. a fluorescent substance and the matrix material. In order to be able to exchange electrons, the molecules between which the electron exchange is to take place require appropriate redox potentials. In the case of the Förster transfer mechanism, a dipole-dipole interaction is responsible for the energy transfer. For this purpose, the two molecules must have a spectral overlap. According to the inventors' recognition, however, by means of the Förster mechanism the energy can only be transferred from one singlet state to another singlet state, whereas by means of a Dexter mechanism the energy can also be implemented from one triplet state to another triplet state since here it is only necessary to comply with the law of conservation of spin.

On account of the combination according to the invention of fluorescent substances (singlet emitters) and phosphorescent substance (triplet emitters) in layers between which an energy transfer is possible, a significantly higher radiation yield can be obtained than is possible with singlet emitters and triplet emitters which lie in layers between which no energy transfer takes place. The spatial separation of singlet and triplet emitters additionally ensures that no radiationless quenching processes are possible between the two systems. The spectral extension of the overall emission spectrum of the device is also advantageous. On account of the conversion of the energy of the triplet excitons that is otherwise emitted as thermal radiation into visible triplet emission, an increased lifetime of the device results on account of the reduction of the thermal radiation.

Substances suitable for producing a device according to the invention are presented below. This enumeration should be regarded as mentioning possible examples and not as an exhaustive list.

The following materials or combinations of materials are suitable for example for the hole injection layer (HIL):
A matrix plus F4-TCNQ (tetrafluoro-tetracyanoquinoline) or derivatives thereof and molybdenum oxides.

The following materials are suitable for example for the hole transporting layer (HTL):
1-TNATA (4,4',4"-tris(N-(naphth-1-yl)-N-phenyl-amino) triphenylamine, 2-TNATA (4,4',4"-tris(N-(naphth-2-yl)-N-phenyl-amino)triphenylamine, MTDATA (4,4',4"-tris(N-3-methylphenyl-N-phenyl-amino)triphenylamine), aNPB (N,N'-bis(naphthalen-1-yl)-N,N'-bis(phenyl)benzidine), bNPD (N,N'-bis(naphthalen-2-yl)-N,N'-bis(phenyl)benzidine), TPD (N,N'-bis(3-methylphenyl)-N,N'-bis(phenyl) benzidine), spTAD (2,2',7,7'-diphenylamino-spiro-9,9'-bifluorene), Cu—PC (phthalocyanine-copper complex) or other PC-metal complexes, TAPC (1,1-bis-[(4-phenyl-)-bis-(4',4"-methyl-phenyl)-amino]-cyclohexane).

The following materials are suitable, for example, for the electron transporting layer (ETL):
Alq$_3$ (tris(8-hydroxyquinoline)aluminum, BAlq$_2$ (bis-[2-methyl-8-quinolato)-[4-phenylphenolato]-aluminum (III)), BPhen (4,7-diphenyl-1,10-phenanthroline), BCP (2,9-dimethyl-4,7-diphenyl-1,10-phenanthroline), OXD7, OXD8, TPBi (1,3,5-tris-(1-phenyl-1H-benzimidatol-2-yl)-benzene), TAZ (3-(4-biphenyl)-4-phenyl-5-(4-tert-butylphenyl)1-2,4-triazole), TAZ2 (3,5-diphenyl-4-naphth-1-yl-1,2,4-triazole), t-Bu-PBD (2-(-biphenyl)-5-(4-tert-butyl-phenyl)-1,3,4-oxadiazole), triazine or triazine derivatives.

The following phosphorescent materials or combinations of materials are suitable for example as phosphorescent substance:
FIr6, FPt1 ([2-(4',6'-difluorophenyl)-pyridinato)-acetylacetonate[-platinum-II), FIrpic (bis(3,5-difluoro-2-(2-pyridyl) phenyl-(2-carboxypyridyl)-iridium-III), FIrN4, Irppy3 (fac-tris(2-phenyl-pyridyl)iridium complex), Ir(ppy)$_2$acac, Ir(type)$_3$ (tris[2-(4-totyl)-pyridinato]-iridium(III)), Ir(typ)$_2$acac, Ir(bt)$_2$acac, Ir(btp)$_2$acac (bis[2-(2'-benzothienyl-pyridinato]-[acetyl-acetonato]-iridium(III)), Ir(dbp)$_2$acac (iridium(III)bis(dibenzo-[f,h]quinoxaline) (acetylacetonate)), Ir(mdp)$_2$acac (iridium(III)bis(2-methyldibenzo-[f,h]quinoxaline)(acetylacetonate)), Ir(pq)$_3$, Ir(pq)$_2$acac, Ir(piq)$_3$, (CF3ppy)$_2$Ir(pic)m PtOEP (platiniumoctaethylporphyrine).

The following materials or combinations of materials are suitable for example for the layer or as matrix material in which both the fluorescent and the phosphorescent substance can be incorporated:
CBP (4,4'-bis(carbazol-9-yl)-2-2'dimethyl-biphenyl), TCTA (4,4',4"-tris(n-(naphth-2-yl)-N-phenyl-amino)triphenylamine), mCP, TCP (1,3,5-tris-carcazol-9-yl-benzene), CPF, CDBP (4,4'-bis(carbazol-9-yl)-2,2'-dimethyl-biphenyl), DPVBi (4,4-bis(2,2-diphenyl-ethen-1-yl)-diphenyl), spiro-PVBi (spiro-4,4'-bis(2,2-diphenyl-ethen-1-yl)-diphenyl), UGH1, UGH2, UGH3, UGH4, CzSi, ADN (9,10-Di(2-naphthyl)anthracene), TBADN, MADN, perylene, carbazole derivatives, fluorene derivatives.

The following materials or combinations of materials are suitable for example as fluorescent substance:
DCM (4-(dicyanomethylene)-2-methyl-6-(p-dimethylamino-styryl)4H-pyrane), DCM2 (4-(dicyanomethylene)-2-methyl-6-(julolidin-4-yl-vinyl)-4H-pyrane), DCJTB, rubrene(5,6,11,12-tetraphenyl-naphthacene), coumarin (C545T), BCzVBi, BCzVb, TBSA (9,10-bis[(2",7""-di-t-butyl)-9',9"-spirobifluorenyl]anthracene), DPAVBi, DPAVB, Zn complexes, Cu complexes.

DETAILED DESCRIPTION OF THE DRAWINGS

Figure 1:
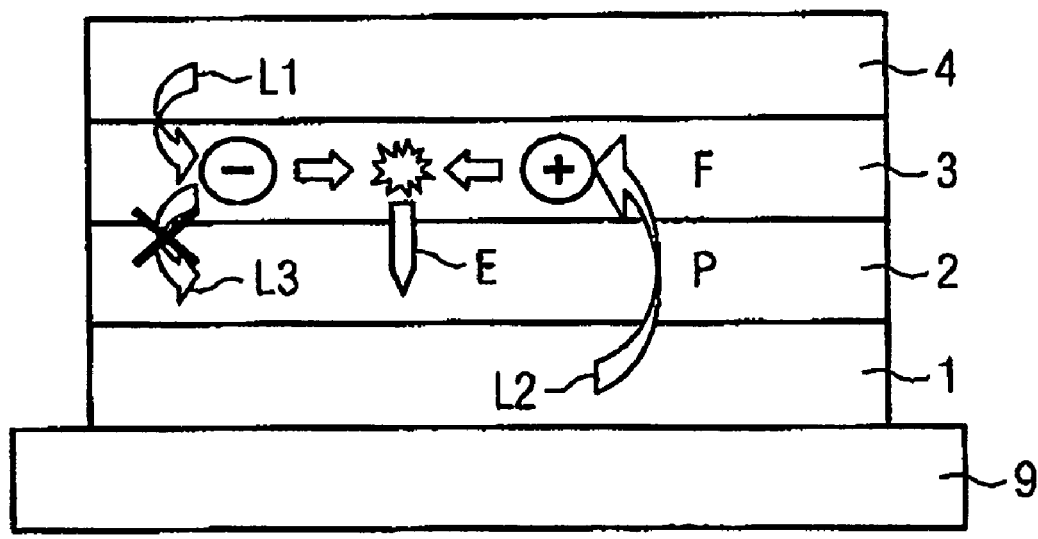
FIG. 1 shows a schematic side view of one embodiment of a radiation emitting device.

FIG. 1 shows a schematic side view of one embodiment of the radiation emitting device. The latter comprises the five layers illustrated. In this case, the bottommost layer 9 is a substrate, and the succeeding layer 1 is the anode. Layer 2 is a second charge carrier transporting layer, a unipolar hole transporting layer, which cannot transport electrons or blocks electrons. Arranged thereon is the first charge carrier transporting layer 3, which transports both electrons and holes and is therefore ambipolar. The cathode is represented by layer 4. The second charge carrier transporting layer 2 contains the phosphorescent substance P, and the first charge carrier transporting layer 3 contains the fluorescent substance F. The electrons, illustrated schematically as encircled minus signs, are injected from the cathode 4 into the first charge carrier transporting layer 3, illustrated schematically by the arrow L1. From said layer they cannot diffuse further into the second charge carrier transporting layer 2 since the latter blocks or cannot transport electrons, illustrated schematically by the crossed out arrow L3. The holes, illustrated schematically as encircled plus signs, which are injected from the anode 1 into the second charge carrier transporting layer 2, are transported by the second charge carrier transporting layer 2 into the first charge carrier transporting layer 3, illustrated schematically by the arrow L2. The excitons, illustrated schematically as an asterisk, formed by recombination of electrons and holes in the first charge carrier transporting layer 3 can diffuse into the second charge carrier transporting layer 2, or the energy, illustrated schematically by the arrow E, can be transferred by means of energy transfer mechanisms into the second charge carrier transporting layer 2 and excite the phosphorescent substance P to phosphorescence there. Since the second charge carrier transporting layer 2 is largely free of electrons, recombination of electrons and holes cannot take place and, consequently, nor can any excitons be formed in said layer. The fluorescent substance F situated in the first charge carrier transporting layer 3 is likewise excited by the energy of the excitons, which are formed in this layer, by means of energy transfer mechanisms. Consequently, different electroluminescent substances (F and P) arranged in different layers (3 and 2) are electronically excited by energy of excitons, whereas the energy originates from the first charge carrier transporting layer 3.

Figure 2:
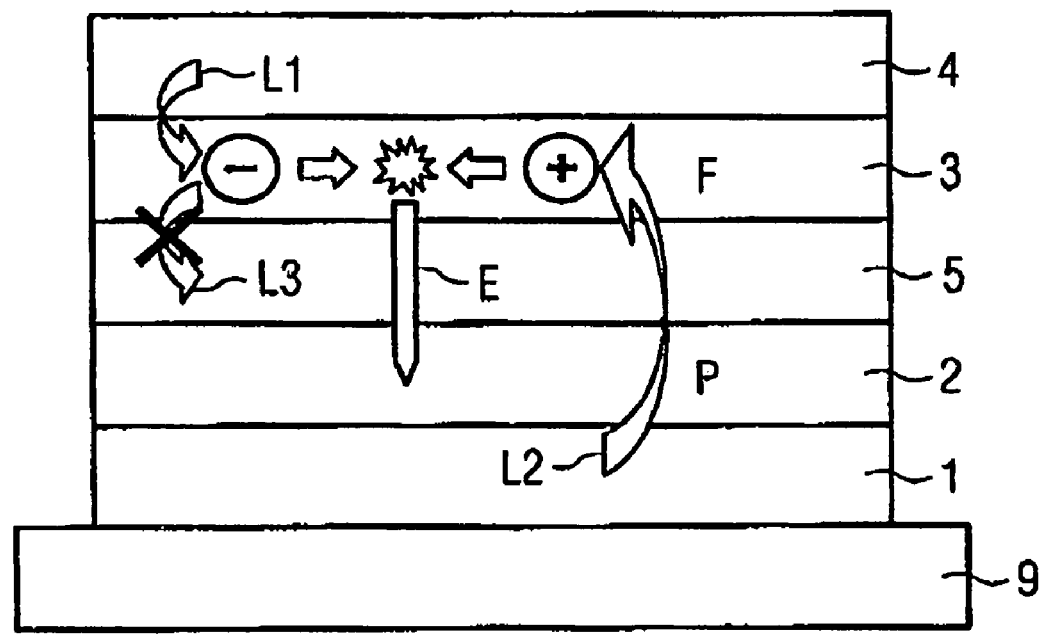
FIG. 2 shows a schematic side view of a possible further embodiment of a radiation emitting device.

FIG. 2 shows a schematic side view of a further embodiment of the radiation emitting device. The latter comprises six layers illustrated. In this case, the bottommost layer 9 is a substrate, and the succeeding layer 1 is the anode. Layer 2 is the second charge carrier transporting layer, a hole transporting layer. The layer 5 represents a first charge carrier blocking layer, here an electron blocking layer. Arranged thereon is the first charge carrier transporting layer 3, a layer which transports both electrons and holes. The cathode is represented by layer 4. The second charge carrier transporting layer 2 contains the phosphorescent substance P and the first charge carrier transporting layer 3 contains the fluorescent substance F. The electrons, represented schematically as encircled minus signs, are injected from the cathode 4 into the first charge carrier transporting layer 3. From said layer they cannot diffuse further into the layer 5 since the latter blocks electrons, illustrated schematically by the crossed out arrow L3. The holes, illustrated schematically as encircled plus signs, which are injected from the cathode into the second charge carrier transporting layer, are transported from the second charge carrier transporting layer 2 through the layer 5 into the first charge carrier transporting layer 3, illustrated schematically by the arrow L2. The excitons, illustrated schematically as an asterisk, formed by recombination of electrons and holes in the first charge carrier transporting layer 3 can diffuse through the layer 5 into the second charge carrier transporting layer 2, or the energy, illustrated schematically by the arrow E, can be transferred by means of energy transfer mechanisms into the second charge carrier transporting layer 2 and excite the phosphorescent substance P to phosphorescence there. The layer 5 blocks the charge carriers having the first charge, here the electrons, such that the layer 2 is largely free of electrons. Thus, recombination of electrons and holes cannot take place and, consequently, excitons cannot be formed in the second charge carrier transporting layer 2. The spatial separation between the layer 2 containing the phosphorescent substance P and the first charge carrier transporting layer 3 containing the fluorescent substance F is even larger in the embodiment illustrated in FIG. 2 than in the embodiment illustrated in FIG. 1, in which the layers 2 and 3 are directly adjacent.

Figure 3:
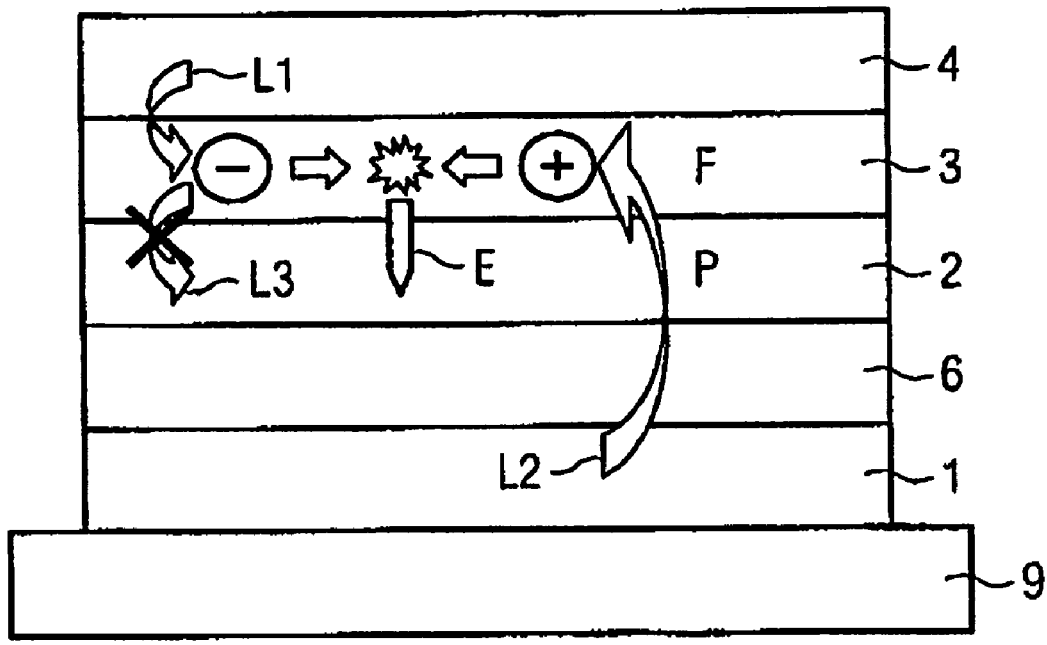
FIG. 3 shows a schematic side view of a possible further embodiment of a radiation emitting device.

FIG. 3 shows a schematic side view of a further embodiment of the radiation emitting device. The latter comprises the six layers illustrated. In this case, the bottommost layer 9 is a substrate, and the succeeding layer 1 is the anode. Layer 6 represents an exciton blocking layer. Layer 2 is the second charge carrier transporting layer, a hole transporting layer, which does not transport electrons or transports them only to a subordinate extent. Arranged on the hole transporting layer 2 is the first charge carrier transporting layer 3, which transports both electrons and holes. The cathode is represented by layer 4. The second charge carrier transporting layer 2 contains the phosphorescent substance P, and the first charge carrier transporting layer 3 contains the fluorescent substance F. The electrons, illustrated schematically as encircled minus signs, are injected from the cathode 4 into the first charge carrier transporting layer 3, illustrated schematically by the arrow L1. From said layer they cannot diffuse further into the second charge carrier transporting layer 2 since the latter blocks or cannot transport electrons, illustrated schematically by the crossed out arrow L3. The holes, illustrated schematically as encircled plus signs, which are injected from the anode 1 into the exciton blocking layer 6, are transported through the second charge carrier transporting layer 2 into the first charge carrier transporting layer 3, illustrated schematically by the arrow L2. The excitons, illustrated schematically as an asterisk, formed by recombination of electrons and holes in the first charge carrier transporting layer 3 can diffuse into the second charge carrier transporting layer 2, or the energy, illustrated schematically by the arrow E, can be transferred by means of energy transfer mechanisms into the second charge carrier transporting layer 2 and excite the phosphorescent substance P to phosphorescence there. Since the second charge carrier transporting layer 2 is largely free of electrons, recombination cannot take place and, consequently, excitons cannot be formed in said layer. Through the layer 6, the excitons coming from the first charge carrier transporting layer 3 cannot diffuse through the second charge carrier transporting layer 2 into succeeding layers, for example in the direction of the anode, since layer 6 blocks excitons. The radiationless quenching of the excitons at the anode is thus prevented or reduced. The energy of the excitons, primarily of the triplet excitons, can thus largely be taken up by the phosphorescence substance P of the second charge carrier transporting layer 2, which increases the radiation yield of the device.

Figure 4:
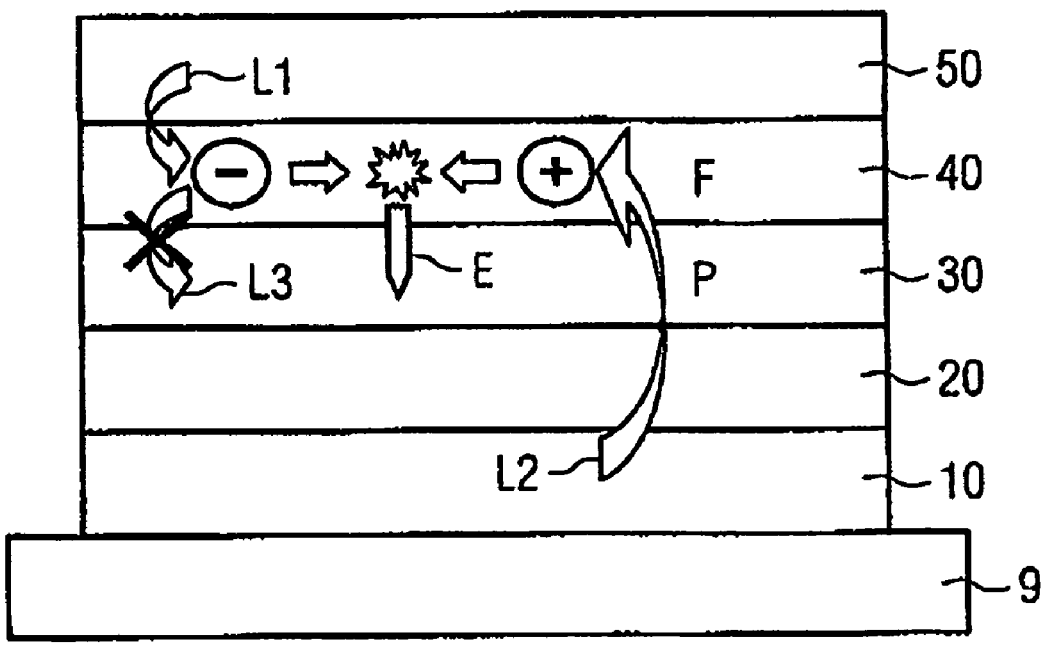
FIG. 4 shows a schematic side view of a special embodiment of a radiation emitting device.

FIG. 4 shows a schematic side view of a further embodiment of the radiation emitting device, an OLED. The six layers illustrated represent the following constituents of the invention. Layer 9 represents a substrate, on which the further layers are applied. Layer 10 is a transparent anode. 20 is a hole inducing layer (HIL), which lowers the energy barrier for hole transfer from the anode into the hole transporting layer. 30 is a hole transporting layer (HTL) containing a phosphorescent substance P. 40 is a layer which transports both electrons and holes and which comprises a fluorescent substance F. The layer 50 represents the cathode.

One preferred embodiment is an OLED having the construction as illustrated schematically in FIG. 4. The OLED is constructed from the following layers: ITO/PEDOT/HTL/LEP/cathode. In this case, ITO (indium tin oxide) is the transparent anode 10, PEDOT is the hole inducing layer 20, and HTL is a hole transporting layer 30. LEP represents a light emitting layer 40, wherein the layer 40 emits light in the form of fluorescence. The cathode composed of aluminum (200 nm) with a thin layer of CsF (1 nm) is represented by the layer 50. In this exemplary embodiment, the LEP 40 is a polymer which fluoresces in the blue range. The HTL 30 contains a phosphorescent substance P which phosphoresces in the red range, that is to say likewise emits light. The material of the HTL 30 is chosen such that holes are transported but electrons are not. That is to say that a meeting of electrons and holes and, consequently, a recombination are possible only in the LEP 40. One part of the energy released by the recombination of electrons and holes then excites the polymer situated in said layer into the singlet state, from which said polymer then emits with emission of light in the blue wavelength range. Another part of the energy, primarily the triplet excitons, is transported by means of energy transfer processes into the HTL 30, in which the phosphorescent substance P is situated. The latter is excited to a triplet level by the energy transferred from the LEP 40, from which level the phosphorescent substance P then relaxes with emission of radiation in the visible range.

The spectrum of such an OLED also has, besides the bands of fluorescent light, a spectrum generally extended to longer wavelengths, as a result of the additional phosphorescence emission. By means of a corresponding choice of materials, such an OLED can generate white light.

The invention is not restricted by the description on the basis of the exemplary embodiments. Rather, the invention encompasses any new feature and any combination of features, which in particular comprises any combination of features in the patent claims, even if this feature or this combination itself is not explicitly explained in the patent claims or exemplary embodiments.

We claim:

1. A radiation emitting device comprising:
   a first electrode, which emits first charge carriers having a first charge during operation;
   a first charge carrier transporting layer, which comprises a fluorescent substance and is arranged on the first electrode;
   a second charge carrier transporting layer, which contains at least two different phosphorescent substances and is arranged on the first charge carrier transporting layer, the at least two different phosphorescent substances being present as dopants in a charge carrier transportation matrix material; and
   a second electrode, which emits second charge carriers having a second charge during operation and is arranged on the second charge carrier transporting layer;
   wherein during operation the second charge carrier transporting layer is substantially free of first charge carriers emitted by the first electrode.

2. The radiation emitting device as claimed in claim 1, wherein the second charge carrier transporting layer is unipolar and can transport only second charge carriers, or blocks first charge carriers.

3. The radiation emitting device as claimed in claim 1, wherein a unipolar charge carrier transporting layer, which blocks the charge carriers having the first charge or can transport only charge carriers having the second charge, is arranged between the first charge carrier transporting layer and the second charge carrier transporting layer.

4. The radiation emitting device as claimed in claim 1, wherein the radiation emitting device comprises an organic light emitting diode, and wherein one of the first charge carrier transporting layer, the second charge carrier transporting layer, the phosphorescent substance and the fluorescent substance comprise organic materials.

5. The radiation emitting device as claimed in claim 1, wherein a recombination of charge carriers having the first charge and charge carriers having the second charge can result in the formation of excitons as excited electronic states, which comprise singlet and triplet excitons.

6. The radiation emitting device as claimed in claim 5, wherein the excitons formed in the first charge carrier transporting layer comprise triplet excitons, and wherein the phosphorescent substance emits phosphorescent radiation upon excitation by the energy of the triplet excitons formed in the first charge carrier transporting layer.

7. The radiation emitting device as claimed claim 1, wherein a recombination of charge carriers having the first charge and charge carriers having the second charge takes place only in the first charge carrier transporting layer.

8. The radiation emitting device as claimed in claim 1, wherein the first electrode is an anode, the first charge carrier transporting layer is a hole transporting and electron transporting layer, the second charge carrier transporting layer is an electron transporting layer, and the second electrode is a cathode.

9. The radiation emitting device as claimed in claim 8, wherein the second charge carrier transporting layer is a hole blocking, or exclusively electron transporting layer.

10. The radiation emitting device as claimed in claim 1, wherein the first electrode is a cathode, wherein the first charge carrier transporting layer is a hole transporting and electron transporting layer, wherein the second charge carrier transporting layer is a hole transporting layer, and wherein the second electrode is an anode.

11. The radiation emitting device as claimed in claim 10, wherein the second charge carrier transporting layer is an electron blocking or exclusively hole transporting layer.

12. The radiation emitting device as claimed in claim 1, wherein an exciton blocking layer is situated between the second charge carrier transporting layer and the second electrode.

13. The radiation emitting device as claimed in claim 1, wherein the fluorescent substance comprises an organic material.

14. The radiation emitting device as claimed in claim 1, wherein the fluorescent substance is present as a dopant in a charge carrier transporting matrix material.

15. The radiation emitting device as claimed in claim 1, wherein the phosphorescent substance comprises an organic material.

16. The radiation emitting device as claimed in claim 1, wherein the phosphorescent substances emit with different wavelengths.

17. The radiation emitting device as claimed in claim 16, wherein the second charge carrier transporting layer has partial regions which each comprise a substance that is phosphorescent at different wavelengths, and the wavelength of the emitted radiation of the phosphorescent substance increases with greater distance from the first charge carrier transporting layer.

18. The radiation emitting device as claimed in claim 1, wherein HOMO/LUMO levels of the second charge carrier transporting layer are coordinated with the HOMO/LUMO levels of the first charge carrier transporting layer such that no charge carriers having the first charge can pass into the second charge carrier transporting layer.

19. The radiation emitting device as claimed in claim 1, wherein HOMO/LUMO levels of the second charge carrier transporting layer are coordinated with the HOMO/LUMO levels of the first charge carrier transporting layer such that triplet excitons can pass from the first into the second charge carrier transporting layer.

20. The radiation emitting device as claimed in claim 1, wherein the thickness of the second charge carrier transporting layer is coordinated with the diffusion length of the triplet excitons, such that the triplet excitons can diffuse through the entire second charge carrier transporting layer.

21. The radiation emitting device as claimed in claim 1, wherein at least two second charge carrier transporting layers are present and the total thickness of all the second charge carrier transporting layers is less than or equal to the diffusion length of the triplet excitons.

22. The radiation emitting device as claimed in claim 1, wherein a charge carrier transport path for transporting the first and second charge carriers during operation runs through the device and the charge carrier transport path for the first charge carriers is restricted to that region of the device which is delimited by the first electrode and the first charge carrier transporting layer and the charge carrier transport path of the second charge carriers runs at least through the second charge carrier transporting layer and the first charge carrier transporting layer.

23. A radiation emitting device comprising:
   a first electrode which emits first charge carriers having a first charge during operation;
   a first charge carrier transporting layer comprising a fluorescent substance and arranged on the first electrode;
   at least two second charge carrier transporting layers containing a phosphorescent substance and arranged on the first charge carrier transporting layer; and
   a second electrode which emits second charge carriers having a second charge during operation and arranged on the second charge carrier transporting layer;
   wherein during operation the second charge carrier transporting layer is substantially free of first charge carriers emitted by the first electrode; and
   wherein a total thickness of all the second charge carrier transporting layers is less than or equal to a diffusion length of a triplet exciton.

24. A radiation emitting device comprising:
   a first electrode which emits first charge carriers having a first charge during operation;
   a first charge carrier transporting layer, which comprises a fluorescent substance and is arranged on the first electrode;
   at least two second charge carrier transporting layers, which are arranged on the first charge carrier transporting layer;
   wherein each second charge carrier transporting layer comprises a phosphorescent substance which emits at a different wavelength; and
   a second electrode which emits second charge carriers having a second charge during operation and is arranged on the second charge carrier transporting layer,
   wherein during operation the second charge carrier transporting layer is substantially free of first charge carriers emitted by the first electrode.

25. The radiation emitting device as claimed in claim 24, wherein the second charge carrier transporting layers are arranged such that the wavelength of the emitted radiation increases with greater distance from the first charge carrier transporting layer.

26. The radiation emitting device as claimed in claim 24, wherein HOMO/LUMO levels of all the second charge carrier transporting layers are coordinated with one another such that an exciton transfer through all the charge carrier transporting layers can be effected from the first charge carrier transporting layer.

* * * * *